US010524354B2

(12) United States Patent
Oguri et al.

(10) Patent No.: US 10,524,354 B2
(45) Date of Patent: Dec. 31, 2019

(54) ELECTRONIC DEVICE

(71) Applicant: Murata Manufacturing Co., Ltd., Nagaokakyo-shi, Kyoto-fu (JP)

(72) Inventors: Shinya Oguri, Nagaokakyo (JP); Wataru Tamura, Nagaokakyo (JP); Kanto Iida, Nagaokakyo (JP); Kuniaki Yosui, Nagaokakyo (JP); Isamu Morita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/109,918

(22) Filed: Aug. 23, 2018

(65) Prior Publication Data

US 2018/0368252 A1  Dec. 20, 2018

Related U.S. Application Data

(63) Continuation of application No. PCT/JP2017/011578, filed on Mar. 23, 2017.

(30) Foreign Application Priority Data

Apr. 1, 2016  (JP) .................. 2016-074242

(51) Int. Cl.
| | | |
|---|---|---|
| *H05K 1/02* | (2006.01) | |
| *H01P 3/08* | (2006.01) | |
| *H05K 1/11* | (2006.01) | |

(52) U.S. Cl.
CPC ............. *H05K 1/0242* (2013.01); *H01P 3/08* (2013.01); *H01P 3/081* (2013.01); *H01P 3/085* (2013.01); *H05K 1/0221* (2013.01); *H05K 1/11* (2013.01)

(58) Field of Classification Search
CPC ...... H05K 1/0242; H05K 1/11; H05K 1/0221; H01P 3/08; H01P 3/081; H01P 3/085
(Continued)

(56) References Cited

U.S. PATENT DOCUMENTS 6,950,590 B2 * 9/2005 Cheung .................. H01P 3/003
385/129
2005/0156690 A1 * 7/2005 Brunker .................. H01P 3/023
333/238
(Continued)

FOREIGN PATENT DOCUMENTS

| JP | 64-54901 A | 3/1989 |
|---|---|---|
| JP | 2005-012727 A | 1/2005 |

(Continued)

OTHER PUBLICATIONS

Official Communication issued in International Patent Application No. PCT/JP2017/011578, dated Jun. 13, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An electronic device includes a transmission line and a circuit board. The transmission line includes a signal conductor, a base material, a first external connection conductor, a second external connection conductor, and a ground conductor, and defines a stripline. The circuit board includes a first mounting land conductor, a second mounting land conductor, and a radiation reduction conductor. The first mounting land conductor and the second mounting land conductor are provided in a concave portion on the surface of the circuit board, and are respectively connected to the first external connection conductor and the second external connection conductor. The radiation reduction conductor is provided on the lateral surface of the concave portion in which the transmission line is disposed, and is in contact (Continued)

with or adjacent to the first lateral surface and the second lateral surface of the base material.

18 Claims, 7 Drawing Sheets

(58) Field of Classification Search
USPC .................. 333/1, 4, 5, 238, 245, 246, 247
See application file for complete search history.

(56) References Cited

U.S. PATENT DOCUMENTS

| | | |
|---|---|---|
| 2011/0165847 A1 | 7/2011 | Kawasaki |
| 2012/0274423 A1* | 11/2012 | Kato .................. H01P 1/20363 333/238 |
| 2013/0127560 A1* | 5/2013 | Kato .................... H05K 1/0253 333/12 |
| 2014/0176264 A1 | 6/2014 | Tago et al. |
| 2016/0064793 A1 | 3/2016 | Yosui |

FOREIGN PATENT DOCUMENTS

| | | |
|---|---|---|
| JP | 2010-103982 A | 5/2010 |
| WO | 2013/069763 A1 | 5/2013 |
| WO | 2015/087893 A1 | 6/2015 |

* cited by examiner

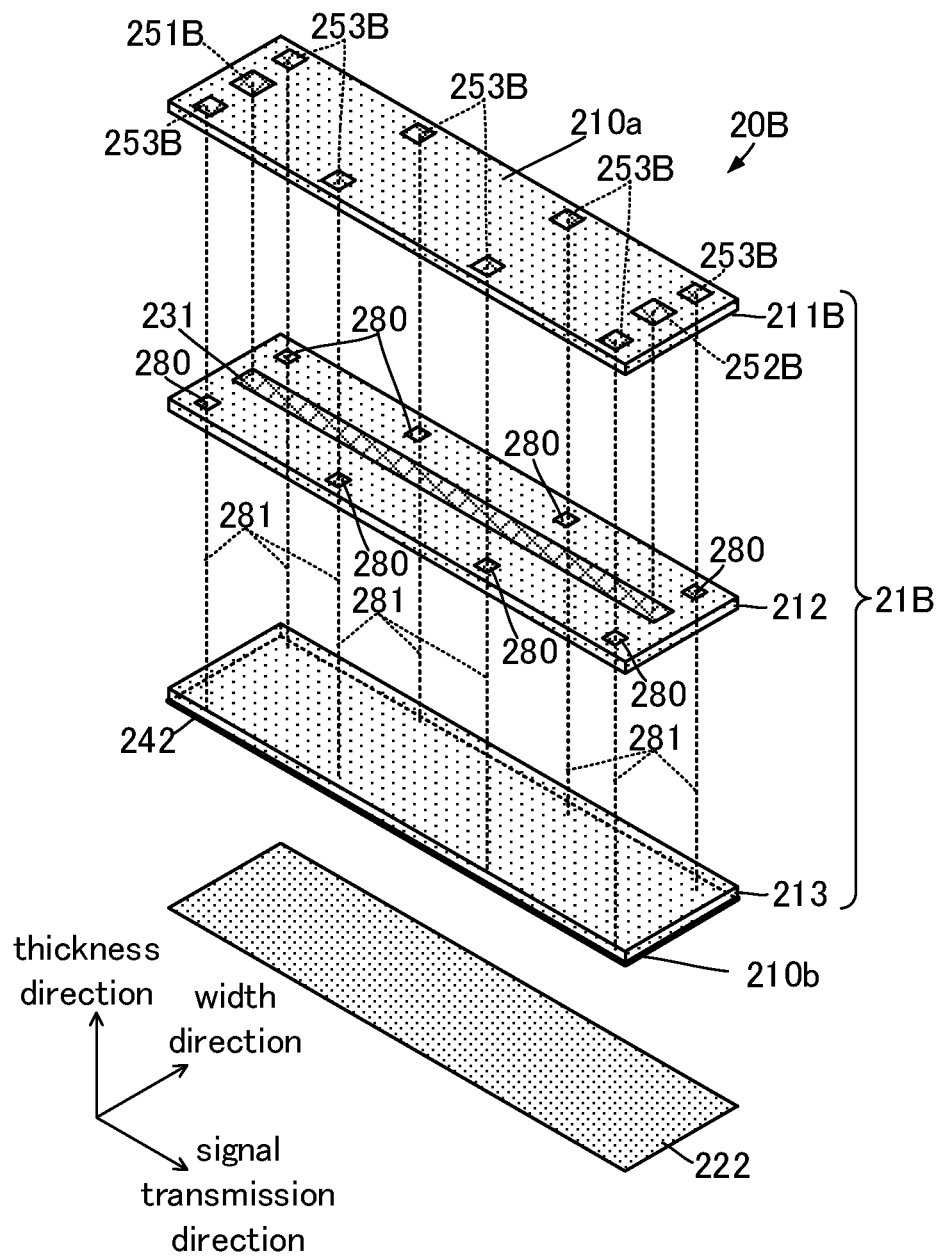

ELECTRONIC DEVICE

CROSS REFERENCE TO RELATED APPLICATIONS

This application claims the benefit of priority to Japanese Patent Application No. 2016-074242 filed on Apr. 1, 2016 and is a Continuation application of PCT Application No. PCT/JP2017/011578 filed on Mar. 23, 2017. The entire contents of each application are hereby incorporated herein by reference.

BACKGROUND OF THE INVENTION

1. Field of the Invention

The present invention relates to an electronic device provided with a transmission line that transmits a high-frequency signal, and a circuit board on which the transmission line is mounted.

2. Description of the Related Art

International Publication No. 2013/069763 discloses an electronic device provided with a high-frequency signal line of a flat cable, and a circuit board. The high-frequency signal line of a flat cable has a structure in which a signal conductor is sandwiched between ground conductors in a thickness direction.

On opposite ends in the signal transmission direction of the high-frequency signal line, connectors to be connected to the signal conductor are mounted. The high-frequency signal line is connected to the circuit board by the connectors.

However, the high-frequency signal line disclosed in International Publication No. 2013/069763 may unnecessarily radiate a high-frequency signal and a harmonic signal of the high-frequency signal from a lateral surface in parallel to the signal transmission direction to the outside. In addition, since the high-frequency signal line disclosed in International Publication No. 2013/069763 includes a flat cable, the high-frequency signal line has flexibility and easily causes positional misalignment when being mounted on the circuit board.

SUMMARY OF THE INVENTION

Preferred embodiments of the present invention provide electronic devices that significantly reduce or prevent unnecessary radiation from a transmission line, such as a high-frequency signal line, to the outside and facilitate mounting of the transmission line on a circuit board.

An electronic device according to a preferred embodiment of the present invention includes a transmission line including a signal conductor including a first end and a second end in a signal transmission direction, and a circuit board on which the transmission line is to be mounted. The transmission line includes a signal conductor, a base material, a first external connection conductor, a second external connection conductor, and a ground conductor. The base material includes the signal conductor, includes a first principal surface and a second principal surface, includes a first lateral surface and a second lateral surface in a direction in which the signal conductor extends, and has flexibility. The first external connection conductor is provided on the first principal surface of the base material and connected to the first end of the signal conductor. The second external connection conductor is provided on the first principal surface of the base material and connected to the second end of the signal conductor. The ground conductor is spaced apart from the signal conductor in the thickness direction of the base material. The circuit board includes a first mounting land conductor, a second mounting land conductor, and a radiation reduction conductor. The first mounting land conductor is to be connected to the first external connection conductor. The second mounting land conductor is to be connected to the second external connection conductor. The radiation reduction conductor is provided along the first lateral surface and the second lateral surface of the base material in a state in which the transmission line is mounted on the circuit board, and is in contact with or adjacent to the first lateral surface and the second lateral surface of the base material.

With this configuration, the leakage of unnecessary radiation from the first lateral surface and the second lateral surface of the transmission line to the outside is significantly reduced by the radiation reduction conductor.

In addition, in an electronic device according to a preferred embodiment of the present invention, the radiation reduction conductor may have a shape projecting from the surface of the circuit board, and may include a plurality of conductor posts that are provided with a distance therebetween along the first lateral surface and the second lateral surface of the base material.

With this configuration, the plurality of conductor posts significantly reduce the leakage of unnecessary radiation to the outside.

In addition, in an electronic device according to a preferred embodiment of the present invention, the height of each of the plurality of conductor posts is preferably greater than or equal to a distance from the surface of the circuit board to the second principal surface.

With this configuration, the leakage of unnecessary radiation to the outside is more effectively significantly reduced.

In addition, an electronic device according to a preferred embodiment of the present invention may have a following configuration. The circuit board may include a first concave portion that has a shape corresponding to the transmission line and that is concave from the surface of the circuit board. The transmission line may be at least partially embedded in the first concave portion. The radiation reduction conductor may be provided on a lateral surface of the first concave portion.

With this configuration, the radiation reduction conductor on the lateral surface of the first concave portion significantly reduces the leakage of unnecessary radiation to the outside. In addition, since the transmission line is at least partially embedded in the circuit board, the height of the electronic device is reduced.

Furthermore, an electronic device according to a preferred embodiment of the present invention may include a second concave portion provided on the bottom surface of the first concave portion and overlapping with the signal conductor in a plan view of the first principal surface, and the second concave portion may include a ground conductor.

With this configuration, a stripline is defined by the signal conductor and ground conductor of the transmission line, and the ground conductor of the circuit board. In addition, since the transmission line is at least partially embedded in the circuit board, the height of the electronic device is reduced. In such a case, since one of the ground conductors of the stripline is in the circuit board, the electronic device more easily achieves a low profile.

In addition, in an electronic device according to a preferred embodiment of the present invention, the height of the lateral surface of the first concave portion is preferably greater than or equal to the thickness of the transmission line.

With this configuration, the leakage of unnecessary radiation to the outside is more effectively significantly reduced.

In addition, in an electronic device according to a preferred embodiment of the present invention, the first external connection conductor is preferably directly bonded to the first mounting land conductor, and the second external connection conductor is preferably directly bonded to the second mounting land conductor.

With this configuration, the electronic device easily achieves a low profile. In such a case, the radiation reduction conductor defines and functions as a guide when the transmission line is provided on the circuit board, so that the transmission line is able to be more reliably mounted on the circuit board.

In addition, an electronic device according to a preferred embodiment of the present invention may preferably have a following configuration. The transmission line may include a plurality of auxiliary ground connection conductors on the first principal surface and the plurality of auxiliary ground connection conductors may be disposed in the direction in which the signal conductor extends. The circuit board may include a plurality of grounding land conductors. The plurality of auxiliary ground connection conductors may be respectively connected to the plurality of grounding land conductors.

With this configuration, the transmission line is more securely and strongly connected to the circuit board. The ground potential of the transmission line is further stabilized.

In addition, in an electronic device according to a preferred embodiment of the present invention, a relative dielectric constant of the base material of the transmission line is preferably lower than a relative dielectric constant of the circuit board.

With this configuration, the electronic device with a low transmission loss is achieved.

In addition, in an electronic device according to a preferred embodiment of the present invention, the transmission line may include a horizontally or substantially horizontally bent portion at which the signal transmission direction changes in a plan view of the first principal surface, in the signal conductor.

With this configuration, even when the transmission line includes a horizontally or substantially horizontally bent portion, the radiation reduction conductor defines and functions as a guide when the transmission line is disposed on the circuit board, so that the transmission line is able to be more reliably mounted on the circuit board.

In addition, in an electronic device according to a preferred embodiment of the present invention, the transmission line may include a vertically or substantially vertically bent portion at which the signal transmission direction changes in a lateral view of the first principal surface, in the signal conductor.

With this configuration, even when the transmission line includes a vertically or substantially vertically bent portion, the radiation reduction conductor defines and functions as a guide when the transmission line is disposed on the circuit board, so that the transmission line is able to be more reliably mounted on the circuit board.

According to various preferred embodiments of the present invention, unnecessary radiation from a transmission line to the outside is able to be significantly reduced, and the transmission line is able to be easily mounted on a circuit board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is an exploded perspective view of a transmission line according to the third preferred embodiment of the present invention.

DETAILED DESCRIPTION OF THE PREFERRED EMBODIMENTS

Figure 1:
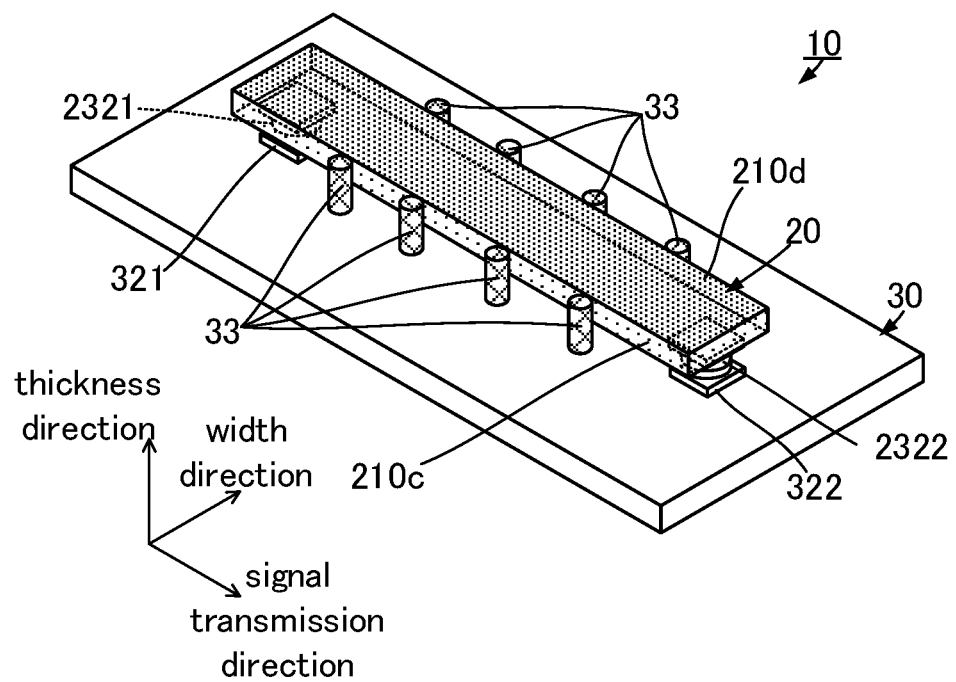
FIG. 1 is an external perspective view of an electronic device according to a first preferred embodiment of the present invention.
Figure 2:
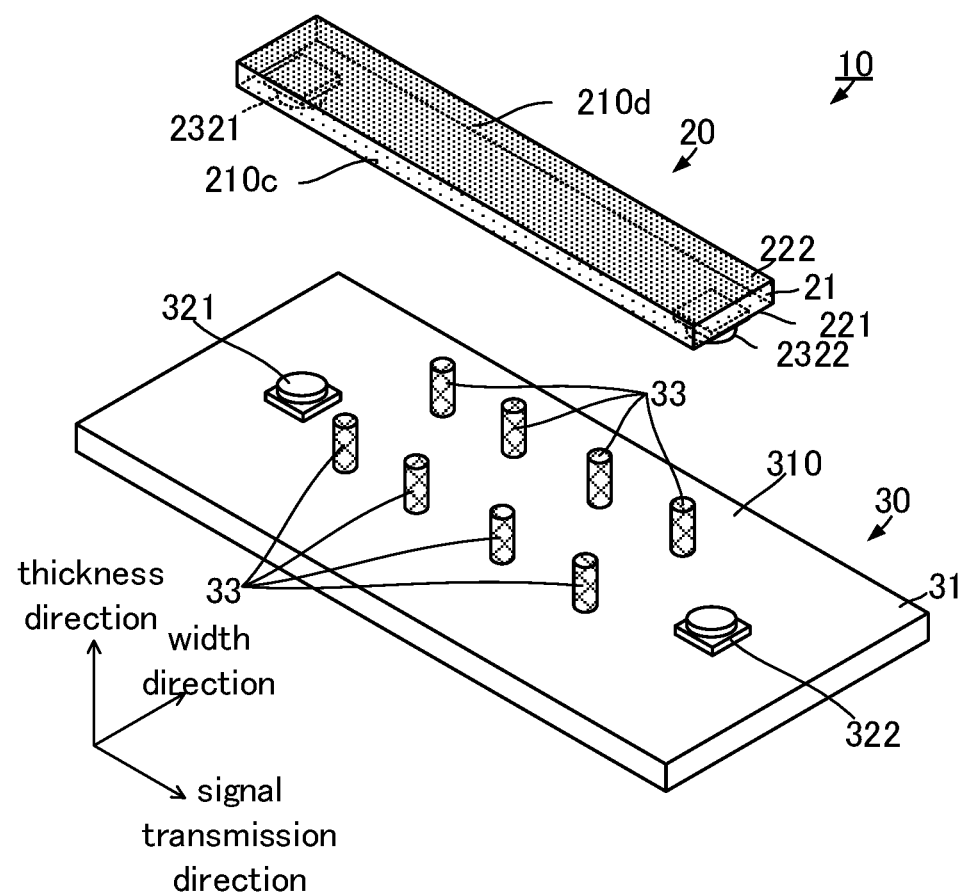
FIG. 2 is an exploded perspective view of the electronic device according to the first preferred embodiment of the present invention.
Figure 3:
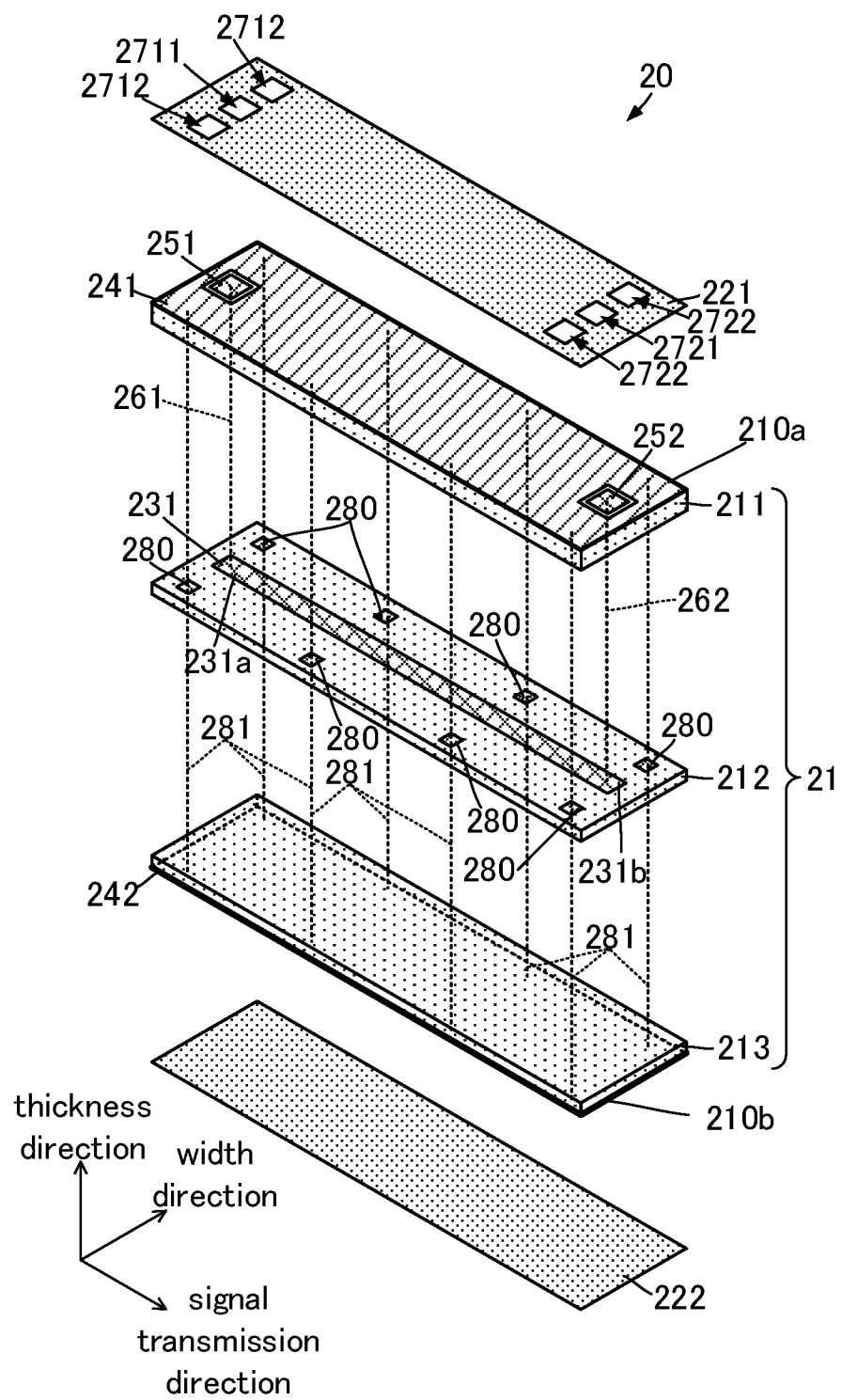
FIG. 3 is an exploded perspective view of a transmission line according to the first preferred embodiment of the present invention.

An electronic device 10 according to a first preferred embodiment of the present invention will be described with reference to the drawings. FIG. 1 is an external perspective view of the electronic device 10 according to the first preferred embodiment of the present invention. FIG. 2 is an exploded perspective view of the electronic device 10 according to the first preferred embodiment of the present invention. FIG. 3 is an exploded perspective view of a transmission line 20 according to the first preferred embodiment of the present invention. It is to be noted that FIG. 3 is a view of the transmission line 20 from which connectors 2321 and 2322 in the transmission line 20 are omitted.

The electronic device 10 includes a transmission line 20 and a circuit board 30.

The transmission line 20 is a flat plate-shaped member including a base material 21, insulating protective films 221 and 222, and connectors 2321 and 2322. The base material 21 has a rectangular or substantially rectangular shape in a plan view and has a shape extending in one direction. Specifically, the base material 21 has a shape extending in a signal transmission direction. The base material 21 includes a first principal surface 210a and a second principal surface 210b that are in parallel or substantially in parallel to the signal transmission direction. The first principal surface 210a and the second principal surface 210b are perpendicular or substantially perpendicular to the thickness direction of the base material 21. The base material 21 includes a first lateral surface 210c and a second lateral surface 210d that connect the first principal surface 210a and the second principal surface 210b and that are provided in parallel or substantially in parallel to the signal transmission direction and perpendicular or substantially perpendicular to the first principal surface 210a and the second principal surface 210b. The first lateral surface 210c and the second lateral surface 210d are perpendicular or substantially perpendicular to the width direction of the base material 21.

As shown in FIG. 3, the base material 21 includes a plurality of dielectric sheets 211, 212, and 213 that are stacked. The plurality of dielectric sheets 211, 212, and 213 are stacked in this order, the principal surface on the side of the dielectric sheet 211 is the first principal surface 210a of the base material 21, and the principal surface on the side of the dielectric sheet 213 is the second principal surface 210b of the base material 21.

On the surface (a surface to be the first principal surface 210a of the base material 21) of the dielectric sheet 211 that is opposite to the dielectric sheet 212, a ground conductor 241, a first external connection conductor 251, and a second external connection conductor 252 are provided. The first external connection conductor 251 is provided in a vicinity of the first end of the signal conductor in the signal transmission direction. The second external connection conductor 252 is provided in a vicinity of the second end (an end opposite to the first end) of the signal conductor in the signal transmission direction. The ground conductor 241 is provided in the entire or substantially the entire area on the surface of the dielectric sheet 211 that is opposite to the dielectric sheet 212, except a portion in which the first external connection conductor 251 and the second external connection conductor 252 are provided. The ground conductor 241 is spaced apart from the first external connection conductor 251 and the second external connection conductor 252.

On the surface of the dielectric sheet 212 on the side of the dielectric sheet 211, a signal conductor 231 and a plurality of auxiliary conductors 280 for grounding are provided. The signal conductor 231 is a conductor extending in the signal transmission direction. The signal conductor 231 is disposed in the center or substantially in the center of the width direction (the width direction of the base material 21) of the dielectric sheet 211. A plurality of auxiliary grounding conductors 280 are provided with a distance therebetween in the signal transmission direction such that the signal conductor 231 is interposed therebetween in the width direction.

A ground conductor 242 is provided in the entire or substantially entire area on the surface (the second principal surface 210b) of the dielectric sheet 213 that is opposite to the dielectric sheet 212.

The dielectric sheets 211, 212, and 213 include a plurality of interlayer connection conductors 281. The ground conductor 241 and the ground conductor 242 are connected to each other by the plurality of interlayer connection conductors 281 and the plurality of auxiliary grounding conductors 280.

The dielectric sheet 211 includes interlayer connection conductors 261 and 262. The first end 231a of the signal conductor 231 is connected to the first external connection conductor 251 by the interlayer connection conductor 261. The second end 231b of the signal conductor 231 is connected to the second external connection conductor 252 by the interlayer connection conductor 262.

With such a configuration, the transmission line 20 includes a high-frequency signal line having a stripline structure in which the signal conductor 231 is interposed between the ground conductor 241 and the ground conductor 242, in the thickness direction of the base material 21.

The first principal surface 210a (the surface on the side of the dielectric sheet 211) of the base material 21 includes an insulating protective film 221. The insulating protective film 221 is provided with holes 2711 and 2721, respectively, in portions that overlap with the first external connection conductor 251 and the second external connection conductor 252. As a result, the first external connection conductor 251 and the second external connection conductor 252 are exposed to the outside on the side of the first principal surface 210a of the base material 21. The insulating protective film 221 is provided with a plurality of holes 2712 and 2722 that partially expose the ground conductor 241. The plurality of holes 2712 are adjacent to the hole 2711, and are located such that the hole 2711 is interposed therebetween in the width direction of the base material 21. The plurality of holes 2722 are adjacent to the hole 2721, and are located such that the hole 2721 is interposed therebetween in the width direction of the base material 21.

The plurality of dielectric sheets 211, 212, and 213 have flexibility. Accordingly, the base material 21 and the transmission line 20 also have flexibility. In addition, the plurality of dielectric sheets 211, 212, and 213 are made of a material having a lower dielectric constant than the circuit board 30. For example, the plurality of dielectric sheets 211, 212, and 213 are preferably primarily made of a liquid crystal polymer. The circuit board 30 is preferably primarily made of epoxy resin, for example. It is to be noted that the plurality of dielectric sheets 211, 212, and 213 may be made of any material having a lower relative dielectric constant than the circuit board 30. As a result, the electronic device 10 is able to be provided with a transmission line 20 having a lower transmission loss than a transmission line formed on the circuit board 30.

The connector 2321 is mounted in a portion to be exposed by the hole 2711 in the first external connection conductor 251 and a portion to be exposed by the plurality of holes 2712 in the ground conductor 241. The connector 2322 is mounted in a portion to be exposed by the hole 2721 in the second external connection conductor 252 and a portion to be exposed by the plurality of holes 2722 in the ground conductor 241.

The circuit board 30 includes a substrate body 31, connectors 321 and 322, and a plurality of conductor posts 33. The plurality of conductor posts 33 correspond to the "radiation reduction conductor".

The substrate body 31 includes a predetermined circuit conductor pattern that achieves the function of the electronic device 10. It is to be noted that the substrate body 31 may include an electronic component, although not shown.

The connectors 321 and 322 are mounted on the surface 310 of the substrate body 31. The connectors 321 and 322 are disposed with a distance therebetween. The distance between the connector 321 and the connector 322 is preferably the same or substantially the same as the distance between the connector 2321 and the connector 2322. The connector 321 is connected to the connector 2321 of the transmission line 20. The connector 322 is connected to the connector 2322 of the transmission line 20.

The plurality of conductor posts 33 are provided on the surface 310 of the substrate body 31. Each of the plurality of conductor posts 33 projects from the surface 310 of the substrate body 31 to the outside. The plurality of conductor posts 33 are located along the first lateral surface 210c and the second lateral surface 210d of the transmission line 20. The plurality of conductor posts 33 are arrayed with a distance therebetween in the signal transmission direction. The plurality of conductor posts 33 are adjacent to or in contact with the first lateral surface 210c and the second lateral surface 210d of the transmission line 20. The height of the plurality of conductor posts 33, in a state in which the transmission line 20 is mounted on the circuit board 30, is preferably greater than or equal to about one-third of the distance from the surface 310 of the circuit board 30 (the substrate body 31) to the second principal surface 210b of the transmission line 20. In particular, the height of the plurality of conductor posts 33, in a state in which the transmission line 20 is mounted on the circuit board 30, is more preferably greater than or equal to the height from the surface 310 of the circuit board 30 to the second principal surface 210b of the transmission line 20.

In addition, the plurality of conductor posts 33 are preferably located at portions that do not at least partially overlap with the plurality of interlayer connection conductors 281 in a plan view of the first lateral surface 210c or the second lateral surface 201d. In other words, although the spread of unnecessary radiation in the width direction of the transmission line 20 is able to be constantly reduced by the plurality of interlayer connection conductors 281, the spread of unnecessary radiation from a portion in which the plurality of interlayer connection conductors 281 are not provided may not be able to be sufficiently reduced. Thus, by locating the plurality of conductor posts 33 at portions that do not at least partially overlap with the plurality of interlayer connection conductors 281 in a plan view of the first lateral surface 210c or the second lateral surface 201d, the spread of unnecessary radiation in the width direction of the transmission line 20 is able to be effectively reduced.

With such a configuration, the spread of unnecessary radiation in the width direction of the transmission line 20 is significantly reduced by the plurality of conductor posts 33. It is to be noted that, in a case in which the height of the plurality of conductor posts 33 is greater than or equal to the height from the surface 310 of the circuit board 30 to the second principal surface 210b of the transmission line 20, the spread of unnecessary radiation is able to be more effectively reduced.

In addition, with this configuration, the plurality of conductor posts 33 define and function as a guide when the transmission line 20 is connected to the circuit board 30. As a result, the transmission line 20 is able to be reliably connected to the circuit board 30. In addition, the transmission line 20, after having been connected, is able to be prevented from detaching or coming off from the circuit board 30.

It is to be noted that the plurality of conductor posts 33 are not limited to the number and the arrangement pattern of FIG. 1 and FIG. 2 and only have to be adjacent to or in contact with the first lateral surface 210c or the second lateral surface 210d of the transmission line 20. In addition, one conductor post may be provided on the side of the first lateral surface 210c and one conductor post may be provided on the side of the second lateral surface 210d. Moreover, the height of all of the plurality of conductor posts 33 may not necessarily be the same. Furthermore, in a lateral view of the circuit board 30, the conductor posts 33 on the side of the first lateral surface 210c and the conductor posts 33 on the side of the second lateral surface 210d do not necessarily have to overlap with each other.

Each of the conductor posts 33 is preferably a dummy conductor that is not connected to another circuit or a conductor to be connected to a ground potential. As a result, the spread of unnecessary radiation is able to be more effectively reduced.

In addition, the transmission line 20 is also able to omit the plurality of interlayer connection conductors 281 that connect the ground conductor 241 and the ground conductor 242. However, the interlayer connection conductors 281 are able to further reduce the spread of unnecessary radiation in the width direction of the transmission line 20.

The electronic device 10 having such a configuration may be formed (manufactured) according to the following example.

To begin with, each of a transmission line 20 and a circuit board 30 is formed.

The transmission line 20 is formed in the following manner, for example. A plurality of dielectric sheets preferably primarily made of a liquid crystal polymer and having copper cladding on one side, for example, are prepared. By performing a patterning process to the plurality of dielectric sheets, the plurality of dielectric sheets 211, 212, and 213 are formed. The plurality of dielectric sheets 211, 212, and 213 are stacked and thermally pressed to form a base material 21. Then, insulating protective films 221 and 222 are formed on the base material 21. Connectors 2321 and 2322 are respectively mounted on the first external connection conductor 251 and the second external connection conductor 252 of the base material 21.

The circuit board 30 is formed in the following manner, for example. By utilizing a known method of manufacturing a printed wiring board, a circuit board 30 including a predetermined circuit conductor pattern is formed. At this time, a first mounting land conductor and a second mounting land conductor are formed on the surface 310 of the circuit board 30 (the substrate body 31) as a portion of the circuit conductor pattern. A connector 321 is mounted on the first mounting land conductor. A connector 322 is mounted on the second mounting land conductor. A plurality of conductor posts 33 are mounted on the surface 310 of the circuit board 30. The plurality of conductor posts 33 may include a plurality of conductor posts that are separately formed and attached to holes on the surface 310 of the circuit board 30 or may include a plurality of conductor posts mounted on a plurality of land conductors for a plurality of conductor posts on the surface 310 of the circuit board 30 or may cause conductors to grow by electroless plating or other suitable method.

Subsequently, the transmission line 20 is disposed on the surface 310 of the circuit board 30 along the plurality of conductor posts 33. The transmission line 20 is fixed on the circuit board 30 by connecting the connector 2321 to the connector 321 and connecting the connector 2322 to the connector 322.

Figure 4:
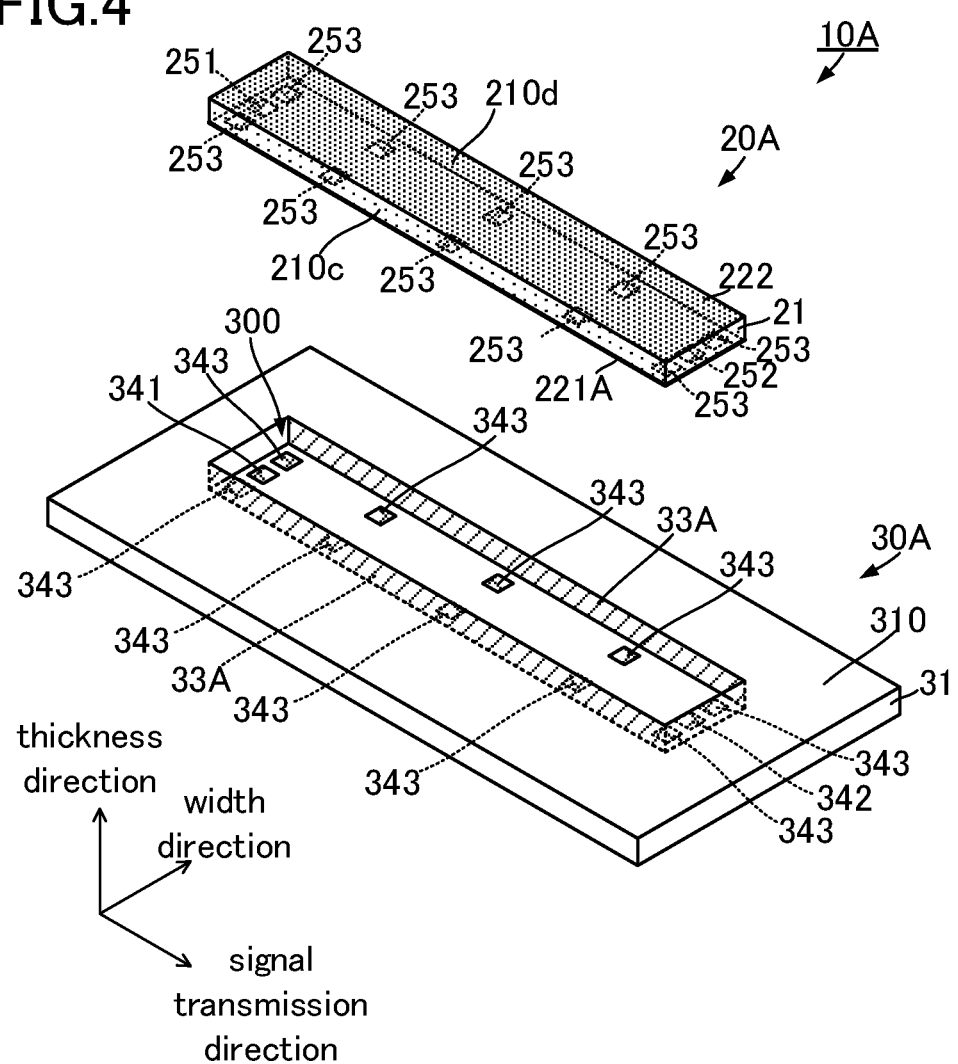
FIG. 4 is an exploded perspective view of an electronic device according to a second preferred embodiment of the present invention.

An electronic device 10A according to a second preferred embodiment of the present invention will be described with reference to the drawings. FIG. 4 is an exploded perspective view of the electronic device 10A according to the second preferred embodiment of the present invention. The electronic device 10A according to the second preferred embodiment is provided with a transmission line 20A and a circuit board 30A.

The transmission line 20A is different from the transmission line 20 according to the first preferred embodiment of the present invention in that the connectors 2321 and 2322 are omitted. In addition, the transmission line 20A includes an insulating protective film 221A including a plurality of holes 253 on the side of the first principal surface 210a of the base material 21. The transmission line 20A is provided with, in addition to the plurality of holes 253 described in the first preferred embodiment, a plurality of holes 253 disposed with a distance therebetween in a direction (the signal transmission direction) in which a signal conductor extends. In a structure in which the plurality of holes 253 expose the ground conductor 241 to the outside, a plurality of auxiliary ground connection conductors are provided on the first principal surface of the transmission line 20A.

The circuit board 30A includes a substrate body 31 and a concave portion 300. The concave portion 300 is provided in the substrate body 31 from the side of the surface 310. In a plan view, the concave portion 300 has the same shape or substantially the same shape as the transmission line 20A, and is large enough to house the transmission line 20A. The concave portion 300 corresponds to the "first concave portion".

The concave portion 300 includes a first mounting land conductor 341, a second mounting land conductor 342, and a plurality of grounding land conductors 343 on the bottom surface of the concave portion 300. The first mounting land conductor 341 is provided in a vicinity of the first end of the concave portion 300 in the signal transmission direction. The second mounting land conductor 342 is provided in a vicinity of the second end of the concave portion 300 in the signal transmission direction. The plurality of land conductors 343 for grounding are provided with a distance in between along the lateral surface of the concave portion 300. The lateral surface of the concave portion 300 is a long surface in the signal transmission direction in the concave portion 300.

The concave portion 300 includes a radiation reduction conductor 33A on the lateral surface of the concave portion 300. The radiation reduction conductor 33A is provided in the entire or substantially the entire area of the lateral surface. The radiation reduction conductor 33A is preferably a dummy conductor that is not connected to another circuit or a conductor to be connected to a ground potential. As a result, the spread of unnecessary radiation is able to be more effectively reduced.

The transmission line 20A is disposed in the concave portion 300 of the circuit board 30A. The first external connection conductor 251 of the transmission line 20A is directly connected to the first mounting land conductor 341 of the circuit board 30A by a bonding member, such as solder, for example. The second external connection conductor 252 of the transmission line 20A is directly connected to the second mounting land conductor 342 of the circuit board 30A by a bonding member, such as solder, for example. The plurality of auxiliary ground connection conductors of the transmission line 20A are directly connected to the plurality of grounding land conductors 343 of the circuit board 30A by bonding members, such as solder, for example.

In this configuration, the radiation reduction conductor 33A on the lateral surface of the concave portion 300 is adjacent to or in contact with the first lateral surface 210c and the second lateral surface 210d of the transmission line 20A. As a result, the spread of unnecessary radiation in the width direction of the transmission line 20A is significantly reduced by the radiation reduction conductor 33A.

In addition, the transmission line 20A is housed in the concave portion 300, so that the transmission line 20A is able to be reliably disposed on the circuit board 30A.

In addition, when being connected by solder bonding, the transmission line 20A easily deforms due to thermal history. However, the deformation of the transmission line 20A is controlled by the concave portion 300. Thus, the transmission line 20A is able to be reliably connected to the circuit board 30A.

In addition, the transmission line 20A is disposed in the concave portion 300, so that the transmission line 20A is able to be lower, as compared to a case in which the transmission line 20A is mounted on the surface 310 of the circuit board 30A. In other words, the electronic device 10A having a low profile is able to be achieved.

It is to be noted that the plurality of auxiliary ground connection conductors of the transmission line 20A and the plurality of grounding land conductors 343 of the circuit board 30A may be able to be omitted. However, the conductors are able to securely and strongly connect the transmission line 20A and the circuit board 30A and are able to improve the bonding reliability of the transmission line 20A and the circuit board 30A. In addition, the ground potential of the transmission line 20A is further stabilized.

It is to be noted that the depth of the concave portion 300 is preferably greater than or equal to about one-third of the height of the transmission line 20A and more preferably greater than or equal to the height of the transmission line 20A. In other words, the transmission line 20A is preferably at least partially embedded in the concave portion 300 of the circuit board 30A, and is more preferably entirely embedded in the concave portion 300 of the circuit board 30A. As a result, the spread of unnecessary radiation is able to be effectively reduced and the low profile of the electronic device 10A is able to be achieved.

The electronic device 10A having such a configuration may be formed (manufactured) according to the following example.

To begin with, each of a transmission line 20A and a circuit board 30A is formed.

A method of manufacturing the transmission line 20A is the same or substantially the same as the method of manufacturing the transmission line 20 according to the first preferred embodiment, except for a process of mounting the connectors 2321 and 2322.

The circuit board 30A may be formed in the following manner, for example. By utilizing a known method of manufacturing a printed wiring board, a circuit board 30A including a concave portion 300 and a predetermined circuit conductor pattern is formed. The concave portion 300 is able to be formed by laser processing and other suitable process. In addition, at this time, the concave portion 300, as a portion of the circuit conductor pattern, includes a first mounting land conductor 341, a second mounting land conductor 342, and a plurality of grounding land conductors 343 on the bottom surface of the concave portion 300. The first lateral surface and the second lateral surface of the concave portion 300 include a radiation reduction conductor 33A. The radiation reduction conductor 33A, for example, is formed by electroless plating or other suitable method.

Subsequently, the first mounting land conductor 341, the second mounting land conductor 342, and the plurality of grounding land conductors 343 of the circuit board 30A are applied with solder paste.

Subsequently, the transmission line 20A is disposed in the concave portion 300. In such a state, a reflow treatment is performed, the first external connection conductor 251 of the transmission line 20A is solder-bonded to the first mounting land conductor 341 of the circuit board 30A, and the second external connection conductor 252 of the transmission line 20A is solder-bonded to the second mounting land conductor 342 of the circuit board 30A. In addition, the plurality of auxiliary ground connection conductors of the transmission line 20A are solder-bonded to the plurality of grounding land conductors 343 of the circuit board 30A. It is to be noted that, instead of applying solder paste to the first mounting land conductor 341, the second mounting land conductor 342, and the plurality of grounding land conductors 343 of the circuit board 30A, the first external connection conductor 251, the second external connection conductor 252, and the plurality of auxiliary ground connection conductors of the transmission line 20A may be applied with solder paste and may be solder-bonded to the circuit board 30A.

Figure 5:
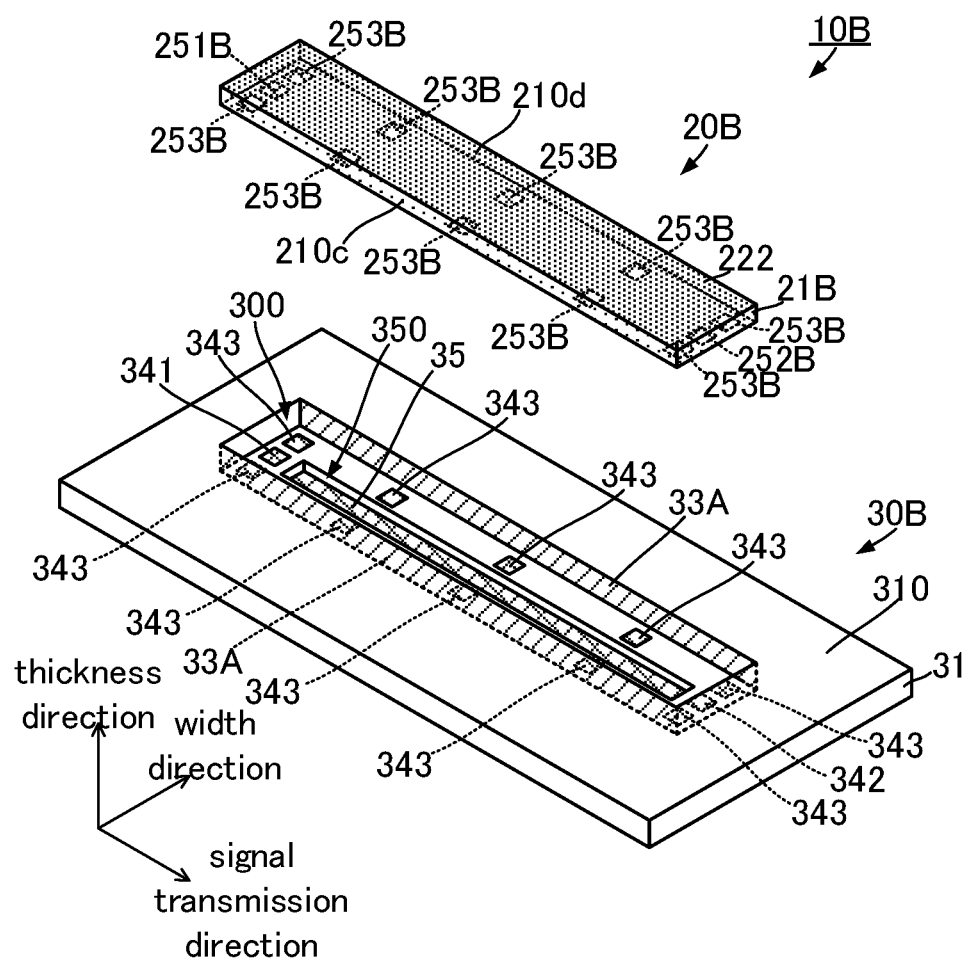
FIG. 5 is an exploded perspective view of an electronic device according to a third preferred embodiment of the present invention.

Subsequently, an electronic device 10B according to a third preferred embodiment of the present invention will be described with reference to the drawings. FIG. 5 is an exploded perspective view of the electronic device 10B according to the third preferred embodiment of the present invention. FIG. 6 is an exploded perspective view of a transmission line 20B according to the third preferred embodiment of the present invention. The electronic device 10B according to the third preferred embodiment is provided with a transmission line 20B and a circuit board 30B.

The transmission line 20B is different from the transmission line 20 according to the first preferred embodiment of the present invention in that the ground conductor 241 and the insulating protective film 221 are omitted. In addition, the transmission line 20B is also different from the transmission line 20 according to the first preferred embodiment of the present invention in that the first principal surface 210a of the base material 21B, that is, the dielectric sheet 211B defining the base material 21B includes a plurality of ground connection conductors 253B. The plurality of ground connection conductors 253B are adjacent to the first lateral surface 210c and the second lateral surface 210d and disposed with a distance therebetween along the first lateral surface 210c and the second lateral surface 210d. Each of the plurality of ground connection conductors 253B is connected to the ground conductor 242 through a plurality of auxiliary grounding conductors 280 and interlayer connection conductors 281.

The circuit board 30B is different from the circuit board 30A according to the second preferred embodiment of the present invention in that a concave portion 350 and a ground conductor 35 are provided. The concave portion 350 corresponds to the "second concave portion". The ground conductor 35 is preferably electrically connected to the plurality of grounding land conductors 343.

The concave portion 350, in a state in which the transmission line 20B is disposed in the concave portion 300 of the circuit board 30B, in a plan view, includes a region that overlaps with the signal conductor 231. The ground conductor 35 is provided on the bottom surface of the concave portion 350.

With such a configuration, the signal conductor 231 of the transmission line 20B is interposed between the ground conductor 242 of the transmission line 20B and the ground conductor 35 of the circuit board 30B, which defines a stripline. As a result, even in a case of a microstrip line structure as the transmission line 20B alone, a stripline is able to be obtained as a high-frequency signal line of the electronic device 10B. Accordingly, the spread of unnecessary radiation is able to be significantly reduced. In addition, the concave portion 350 creates an air space between the signal conductor 231 of the transmission line 20B and the ground conductor 35 of the circuit board 30B. As a result, the dielectric loss in a stripline is reduced, and thus, a high-frequency signal line with a lower transmission loss is able to be achieved.

Figure 7A:
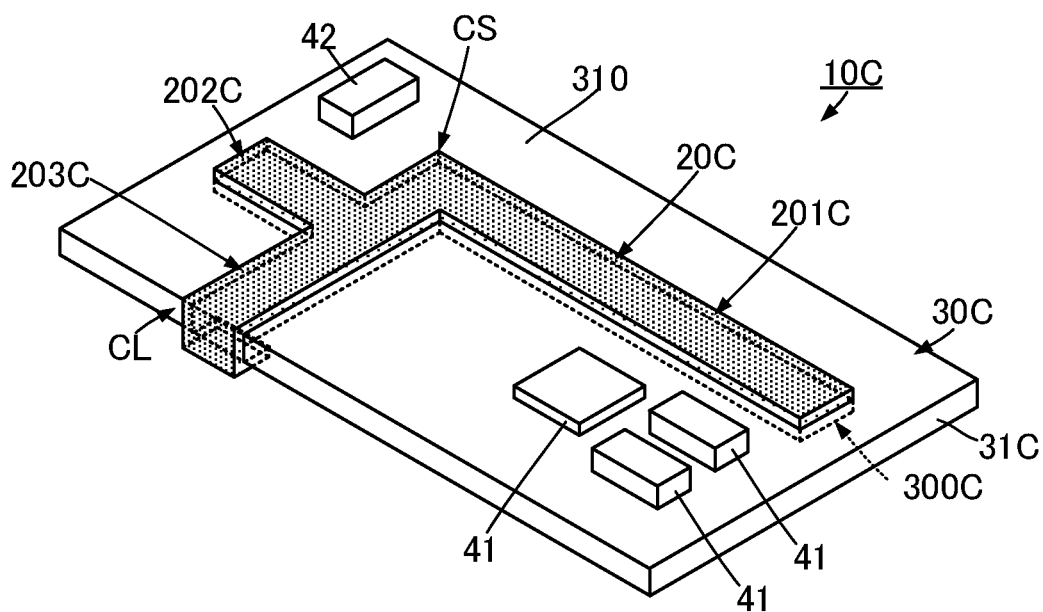
FIG. 7A is an external perspective view of an electronic device according to a fourth preferred embodiment of the present invention.
Figure 7B:
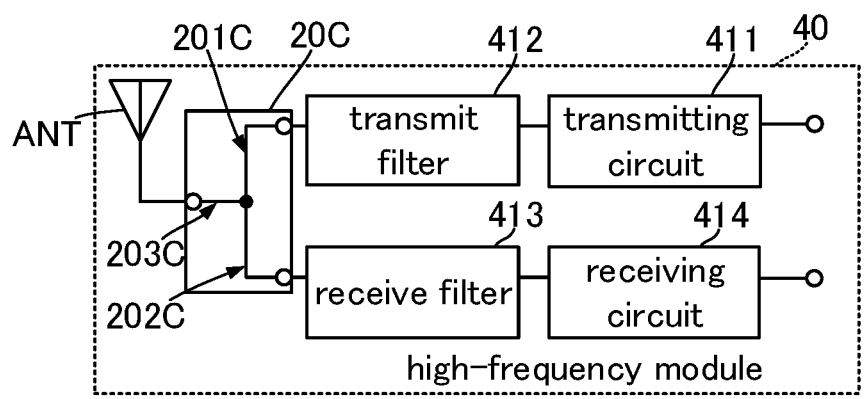
FIG. 7B is an equivalent circuit diagram of the electronic device according to the fourth preferred embodiment of the present invention.

An electronic device 10C according to a fourth preferred embodiment of the present invention will be described with reference to the drawings. FIG. 7A is an external perspective view of the electronic device 10C according to the fourth preferred embodiment of the present invention. FIG. 7B is an equivalent circuit diagram of the electronic device 10C according to the fourth preferred embodiment of the present invention.

The electronic device 10C according to the fourth preferred embodiment is obtained by providing the structure of the electronic device 10A according to the second preferred embodiment.

The electronic device 10C includes a transmission line 20C and a circuit board 30C. The transmission line 20C includes a first transmission portion 201C, a second transmission portion 202C, and a third transmission portion 203C that are integrated. The first transmission portion 201C, the second transmission portion 202C, and the third transmission portion 203C are connected to each other. The basic structure of the first transmission portion 201C, the second transmission portion 202C, and the third transmission portion 203C is the same or substantially the same as the basic structure of the transmission line 20A according to the second preferred embodiment. The first transmission portion 201C includes a horizontally or substantially horizontally bent portion CS at which a direction (the signal transmission direction) that extends in a plan view changes.

The circuit board 30C includes a substrate body 31C. The substrate body 31C includes a concave portion 300C. The basic configuration of the conductor pattern of the concave portion 300C is the same or substantially the same as the basic structure of the conductor pattern of the concave portion 300 according to the second preferred embodiment. The concave portion 300C has the same or substantially the same planar shape as the transmission line 20C. The concave portion 300C includes a portion that extends to the rear surface from the surface 310 of the substrate body 31C through one lateral surface.

The first transmission portion 201C and the second transmission portion 202C of the transmission line 20C are mounted in a portion provided on the surface 310 of the substrate body 31C in the concave portion 300C. The third transmission portion 203C of the transmission line 20C is mounted in the portion that extends to the rear surface from the surface 310 of the substrate body 31C in the concave portion 300C through one lateral surface. As a result, the third transmission portion 203C has a vertically or substantially vertically bent portion CL at which a direction (the signal transmission direction) that extends in a lateral view changes.

A plurality of electronic components 41 and an electronic component 42 are mounted on the surface of the circuit board 30C. The number of mounted electronic components 41 and 42 is not limited to this example, and is properly determined according to the circuit achieved by the electronic device 10C.

The plurality of electronic components 41 are disposed at an end portion opposite to an end portion connected to the second transmission portion 202C and the third transmission portion 203C in the first transmission portion 201C. The electronic component 42 is disposed at an end portion opposite to an end portion connected to the first transmission portion 201C and the third transmission portion 203C in the second transmission portion 202C.

The conductor pattern provides an antenna ANT on the rear surface of the circuit board 30C.

With such a configuration, a high-frequency module 40 as shown in FIG. 7B is able to be obtained as the electronic device 10C. The high-frequency module 40 includes the antenna ANT, the transmission line 20C, a transmitting circuit 411, a transmit filter 412, a receive filter 413, and a receiving circuit 414. The transmitting circuit 411 and the transmit filter 412 are defined by the plurality of electronic components 41 and the conductor pattern provided in the circuit board 30C. The receive filter 413 and the receiving circuit 414 are defined by the electronic components 42 and the conductor pattern provided in the circuit board 30C. The antenna ANT shown in FIG. 7B, as described above, is defined by the conductor pattern provided on the rear surface of the circuit board 30C. The transmission line 20C shown in FIG. 7B is defined by the transmission line 20C shown in FIG. 7A.

With such a configuration, the high-frequency module 40 is able to be reduced in size. In addition, by utilizing the transmission line 20C, a high-frequency module 40 with a low transmission loss is able to be achieved.

In the above-described configuration, the transmission line 20C includes the horizontally or substantially horizontally bent portion CS and the vertically or substantially vertically bent portion CL. However, the transmission line 20C, while being disposed in the concave portion 300C, is mounted on the circuit board 30C, so that the transmission line 20C is easily provided on the circuit board 30C, and the transmission line 20C is able to be prevented from detaching or coming off from the circuit board 30C.

It is to be noted that the high-frequency module 40 is an example and the configuration of the fourth preferred embodiment is applicable to any high-frequency circuits.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
  a transmission line including a signal conductor including a first end and a second end in a signal transmission direction; and
  a circuit board on which the transmission line is to be mounted; wherein
  the transmission line includes:
    a base material including the signal conductor, including a first principal surface and a second principal surface, including a first lateral surface and a second lateral surface in a direction in which the signal conductor extends, and having flexibility;
    a first external connection conductor provided on the first principal surface of the base material and connected to the first end of the signal conductor;
    a second external connection conductor provided on the first principal surface of the base material and connected to the second end of the signal conductor; and
    a ground conductor provided separately from the signal conductor in a thickness direction of the base material; and
  the circuit board includes:
    a first mounting land conductor to be connected to the first external connection conductor;
    a second mounting land conductor to be connected to the second external connection conductor; and
    a radiation reduction conductor provided along the first lateral surface and the second lateral surface of the base material in a state in which the transmission line is mounted on the circuit board, and in contact with or adjacent to the first lateral surface and the second lateral surface of the base material.

2. The electronic device according to claim 1, wherein the radiation reduction conductor projects from a surface of the circuit board, and includes a plurality of conductor posts that are spaced apart along the first lateral surface and the second lateral surface of the base material.

3. The electronic device according to claim 2, wherein a height of each of the plurality of conductor posts is greater than or equal to a distance from the surface of the circuit board to the second principal surface.

4. The electronic device according to claim 2, wherein a height of each of the plurality of conductor posts is greater than or equal to about one-third of a distance from the surface of the circuit board to the second principal surface.

5. The electronic device according to claim 2, wherein the plurality of conductor posts are adjacent to or in contact with the first lateral surface and the second lateral surface of the transmission line.

6. The electronic device according to claim 1, wherein
  the circuit board includes a first concave portion that has a shape corresponding to the transmission line and that is concave from a surface of the circuit board;
  the transmission line is at least partially embedded in the first concave portion; and
  the radiation reduction conductor is provided on a lateral surface of the first concave portion.

7. The electronic device according to claim 6, further comprising:
  a second concave portion provided on a bottom surface of the first concave portion and overlapping with the signal conductor in a plan view of the first principal surface; wherein
  the second concave portion includes a further ground conductor.

8. The electronic device according to claim 6, wherein a height of the lateral surface of the first concave portion is greater than or equal to a thickness of the transmission line.

9. The electronic device according to claim 1, wherein a relative dielectric constant of the base material of the transmission line is lower than a relative dielectric constant of the circuit board.

10. The electronic device according to claim 1, wherein the transmission line includes a horizontally or substantially horizontally bent portion at which the signal transmission direction changes in a plan view of the first principal surface, in the signal conductor.

11. The electronic device according to claim 1, wherein the transmission line includes a vertically or substantially vertically bent portion at which the signal transmission direction changes in a lateral view of the first principal surface, in the signal conductor.

12. The electronic device according to claim 1, wherein the base material includes a plurality of dielectric sheets that are stacked.

13. The electronic device according to claim 12, wherein the ground conductor, the first external connection conductor, and the second external connection conductor are provided on one of the plurality of dielectric sheets.

14. The electronic device according to claim 13, wherein the ground conductor is provided in an entire or substantially an entire area of a surface of the one of the plurality of dielectric sheets, except portions in which the first external connection conductor and the second external connection conductor are provided.

15. The electronic device according to claim 13, wherein the signal conductor is provided on a different one of the plurality of dielectric layers than the one of the plurality of dielectric layers on which the ground conductor, the first external connection conductor, and the second external connection conductor are provided.

16. The electronic device according to claim 1, wherein the first external connection conductor is directly bonded to the first mounting land conductor; and
the second external connection conductor is directly bonded to the second mounting land conductor.

17. The electronic device according to claim 16, wherein the transmission line includes a plurality of auxiliary ground connection conductors on the first principal surface;
the plurality of auxiliary ground connection conductors are disposed in the direction in which the signal conductor extends;
the circuit board includes a plurality of grounding land conductors; and
the plurality of auxiliary ground connection conductors are respectively connected to the plurality of grounding land conductors.

18. The electronic device according to claim 17, wherein the signal conductor is interposed between the plurality of auxiliary grounding connection electrodes in a width direction perpendicular to the direction in which the signal conductor extends.

* * * * *